US009658274B2

(12) United States Patent
Iwakiri et al.

(10) Patent No.: US 9,658,274 B2
(45) Date of Patent: May 23, 2017

(54) LIGHT-EMITTING ELEMENT FAILURE DETECTOR AND METHOD FOR DETECTING LIGHT-EMITTING ELEMENT FAILURE

(75) Inventors: Toshiya Iwakiri, Tokyo (JP); Shigeki Taniguchi, Tokyo (JP)

(73) Assignee: NEC Lighting Ltd., Tokyo (JP)

( * ) Notice: Subject to any disclaimer, the term of this patent is extended or adjusted under 35 U.S.C. 154(b) by 82 days.

(21) Appl. No.: 14/130,125

(22) PCT Filed: Jun. 28, 2012

(86) PCT No.: PCT/JP2012/066620
§ 371 (c)(1),
(2), (4) Date: Dec. 30, 2013

(87) PCT Pub. No.: WO2013/005655
PCT Pub. Date: Jan. 10, 2013

(65) Prior Publication Data
US 2014/0132273 A1    May 15, 2014

(30) Foreign Application Priority Data
Jul. 5, 2011  (JP) .................. 2011-148785

(51) Int. Cl.
*G01R 31/26* (2014.01)
*H05B 33/08* (2006.01)

(52) U.S. Cl.
CPC ..... *G01R 31/2601* (2013.01); *G01R 31/2635* (2013.01); *H05B 33/0815* (2013.01); *H01L 2251/568* (2013.01)

(58) Field of Classification Search
CPC ............ H05B 33/0815; G01R 31/2601; G01R 31/2635
(Continued)

(56) References Cited

U.S. PATENT DOCUMENTS 6,515,434 B1 *  2/2003  Biebl ............................ 315/291
6,570,505 B1 *  5/2003  Malenfant .................... 340/641
(Continued)

FOREIGN PATENT DOCUMENTS

CN      101842914       9/2010
EP       2204856         7/2010
(Continued)

OTHER PUBLICATIONS

International Search Report corresponding to PCT/JP2012/066620, dated Sep. 20, 2012, 3 pages.

*Primary Examiner* — Son Le
*Assistant Examiner* — Akm Zakaria
(74) *Attorney, Agent, or Firm* — Wilmer Cutler Pickering Hale and Dorr LLP

(57) ABSTRACT

A light emitting element failure detector (4) includes a light emitting element (1), a constant current circuit (2) which supplies an electric current to the light emitting element (1), and an electric discharge path which discharges an electric charge such as the light emitting element (1). A light emitting element failure detector (4) further includes an instantaneous current interruption circuit (5) which instantaneously interrupts an electric current to the light emitting element (1) by a current supply path different from the electric discharge path, a diode (60), a DC power supply (61), and a current detector (62). The DC power supply (61) generates a direct-current reference voltage having a positive value lower than a voltage between the anode and cathode of the light emitting element (1) in a normal state. The DC power supply (61), the diode (60), and the current detector (62) which are connected in series constitute a parallel electric path of the light emitting element (1). An anode of the DC power supply (61) and a cathode of the diode (60) are arranged on the anode side of the light emitting element (1). The current detector (62) detects an
(Continued)

electric current which flows in the parallel electric path when an electric current is instantaneously interrupted.

7 Claims, 6 Drawing Sheets

(58) Field of Classification Search
USPC .......................................................... 324/414
See application file for complete search history.

(56) References Cited

U.S. PATENT DOCUMENTS

| | | | |
|---|---|---|---|
| 8,912,798 B2* | 12/2014 | Somayajula | G01R 31/024 324/414 |
| 2006/0176411 A1* | 8/2006 | Furukawa | 349/33 |
| 2009/0160361 A1* | 6/2009 | Shakuda | 315/294 |
| 2010/0225235 A1* | 9/2010 | Nagase | 315/130 |
| 2012/0050697 A1* | 3/2012 | Suzuki | 353/85 |

FOREIGN PATENT DOCUMENTS

| | | | | |
|---|---|---|---|---|
| JP | 2007-227094 | | 9/2007 | |
| JP | 2009-111035 | | 5/2009 | |
| JP | 2009-223145 | | 10/2009 | |
| JP | 2012049178 | * | 8/2010 | ............ H05B 37/03 |
| JP | 2011-077037 | | 4/2011 | |
| JP | 2012-049178 | | 3/2012 | |
| WO | WO-2009/054224 | | 4/2009 | |

* cited by examiner

LIGHT-EMITTING ELEMENT FAILURE DETECTOR AND METHOD FOR DETECTING LIGHT-EMITTING ELEMENT FAILURE

CROSS-REFERENCE TO RELATED APPLICATIONS

This application is a national stage application of International Application No. PCT/JP2012/066620 entitled "Light-Emitting Element Breakdown Detector and Method for Detecting Light-Emitting Element Breakdown," filed on Jun. 28, 2012, which claims the benefit of the priority of Japanese Patent Application No. 2011-148785, filed on Jul. 5, 2011, the disclosures of each of which are hereby incorporated by reference in their entirety.

TECHNICAL FIELD

The present invention relates to a light emitting element failure detector for detecting a failure of a light emitting element and a light emitting element failure detection method.

BACKGROUND ART

Use of an organic electro-luminescence element (hereinafter, referred to as "organic EL element") as a light source of a lighting device is proposed.

When an organic EL element is short-circuited, a voltage Vf corresponding to an impedance between the anode and cathode of an organic EL element is applied between anode and cathode. The voltage Vf is lower than the voltage between the anode and cathode of an organic EL element in a normal state.

Failure detection means described in Patent Literature 1 measures an electric potential Vf of an anode electrode of an organic EL element. When the electric potential Vf of the anode electrode is lower than a reference voltage, the failure detection means of Patent Literature 1 detects a short circuit failure of the organic EL element.

When the organic EL element is short-circuited, an electric current flowing into the organic EL element increases since the impedance between the anode and cathode of the organic EL element decreases.

Failure detection means described in Patent Literature 2 measures the voltage of a resistance connected to an organic EL element in series. Increase in current can be detected by the measured voltage. The failure detection means described in Patent Literature 2 therefore detects a short circuit failure when the measured voltage exceeds a predetermined threshold.

A short circuit failure of the light emitting element can be detected by the measurement of the voltage Vf (output voltage) between the anode and cathode of the light emitting element.

A circuit protector (failure detection means) described in Patent Literature 3 comprises a first comparator and a second comparator. The first comparator outputs a high level voltage when the output voltage of an LED (LIGHT EMITTING DIODE) is larger than a first reference voltage. The first comparator outputs a low level voltage when the output voltage of an LED is smaller than the first reference voltage. The second comparator compares the output voltage of the first comparator with a second reference voltage. The second comparator outputs a low level or a high level voltage depending on the comparison result. The circuit protector detects a short circuit failure from the output voltages of the first comparator and the second comparator.

The above-mentioned failure detection means measures the voltage Vf between the anode and cathode of a light emitting element, or a voltage associated with the Vf. A short circuit failure of a light emitting element is then detected from the measured voltage and the reference voltage.

CITATION LIST

Patent Literature

Patent Literature 1: Unexamined Japanese Patent Application Kokai Publication No. 2009-223145.
Patent Literature 2: Unexamined Japanese Patent Application Kokai Publication No. 2007-227094.
Patent Literature 3: Unexamined Japanese Patent Application Kokai Publication No. 2011-077037.

SUMMARY OF INVENTION

Technical Problem

The voltage Vf between anode and cathode of a light emitting element varies depending on the V-I characteristics, change with time, environmental temperature of the element, or the like. The voltage Vf of the light emitting element changes also depending on the impedance between the anode and cathode of a short-circuited light emitting element.

The present invention has been made in view of the above-mentioned circumstances, and an object of the invention is to provide a light emitting element failure detector and a light emitting element failure detection method, which can detect a short circuit failure without affected by the variation, change, or fluctuation of the voltage Vf between the anode and cathode of a light emitting element.

Solution to Problem

In order to achieve the above objective, a light emitting element failure detector according to a first aspect of the invention is a light emitting element failure detector that detects a short-circuit of a light emitting element in a light emitting element circuit that includes the light emitting element, a current supply path to the light emitting element, a constant current circuit that supplies an electric current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detector comprising:

an instantaneous current interruption circuit that is arranged on the current supply path different from the electric discharge path and that instantaneously interrupts an electric current that the constant current circuit supplies to the light emitting element, and a parallel electric path connected to the light emitting element in parallel between anode and cathode of the light emitting element, wherein the parallel electric path comprises
a diode, a DC power supply that generates a direct current reference voltage having a positive value lower than a voltage between the anode and cathode of the light emitting element in a normal state, and a current detector, wherein the diode, the DC power supply, and the current detector are connected to one another in series, and the diode and the DC power supply are connected to each other such that a cathode of the diode and an anode of the DC power supply are each arranged on the anode side of the light emitting element, and the current detector detects the existence of an electric current on the parallel electric path in a period when an electric current is instantaneously interrupted by the instantaneous current interruption circuit.

A light emitting element failure detection method according to a second aspect of the invention is a light emitting element failure detection method that detects a short-circuit of a light emitting element in a light emitting element circuit that includes the light emitting element, a current supply path to the light emitting element, a constant current circuit that supplies an electric current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detection method comprising:

an instantaneous current interruption step in which, on the current supply path different from the electric discharge path, an electric current that the constant current circuit supplies to the light emitting element is instantaneously interrupted, and a current detection step in which the existence of an electric current on a parallel electric path in a period is detected when an electric current is instantaneously interrupted in the instantaneous current interruption step, in a state in which a DC power supply that generates a direct current reference voltage having a positive value lower than a voltage between the anode and cathode of the light emitting element in a normal state and a diode are connected to each other, and in the parallel electric path connected to the light emitting element in parallel between the anode and cathode of the light emitting element, the diode and the DC power supply are connected to each other such that a cathode of the diode and an anode of the DC power supply are each arranged on the anode side of the light emitting element.

Advantageous Effects of Invention

According to the present invention, a light emitting element failure detector and a light emitting element failure detection method, which can detect a short circuit failure without affected by the variation, change, fluctuation or the like of the voltage Vf between the anode and cathode of a light emitting element, can be provided.

DESCRIPTION OF EMBODIMENTS

Embodiment 1

Figure 1:
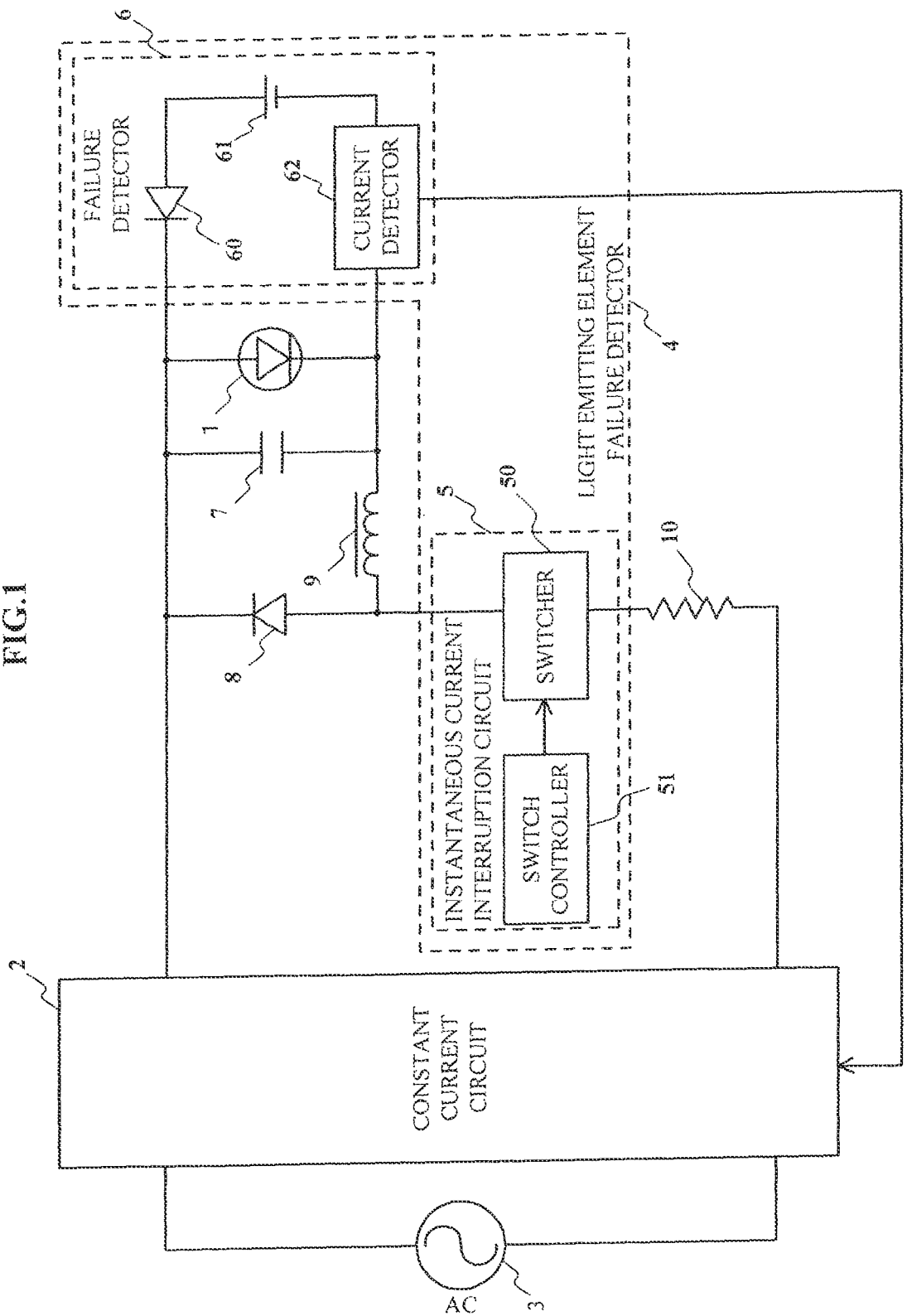
FIG. 1 is a block diagram illustrating the constitution of a light emitting element circuit comprising a light emitting element failure detector according to Embodiment 1 of the present invention.

FIG. 1 illustrates the constitution of a light emitting element circuit comprising a light emitting element failure detector according to Embodiment 1 of the present invention. The light emitting element circuit comprises a light emitting element 1, a constant current circuit 2 which supplies a predetermined electric current to the light emitting element 1, an AC power supply 3 which supplies electric power to the constant current circuit 2, and a light emitting element failure detector 4 which detects a short-circuit of the light emitting element 1. The light emitting element failure detector 4 comprises an instantaneous current interruption circuit 5 and a failure detector 6.

In the light emitting element circuit, a capacitance is considered to be connected to the light emitting element 1 in parallel. A capacitor 7 represents the capacitance (FIG. 1). A diode 8 is connected to the capacitor 7 and the light emitting element 1 in parallel. Further, a coil 9 is connected to at least one of electric paths connecting the capacitor 7 and the light emitting element 1 and the diode 8. The diode 8 is arranged in a polarity opposite to the polarity of the light emitting element 1 which is connected in parallel thereto. The capacitor 7, the light emitting element 1, the coil 9 and the diode 8 together forms an electric discharge path. The electric discharge path discharges an electric charge which the light emitting element 1 and the capacitor 7 have accumulated when a current supply to the light emitting element 1 is stopped. The coil 9 may be a resistance.

A resistance 10 is connected to the light emitting element 1 in series. The constant current circuit 3 supplies an electric current to the light emitting element 1 via the resistance 10.

The instantaneous current interruption circuit 5 comprises a switcher 50 and a switch controller 51. The switcher 50 instantaneously interrupts an electric current by switching between supplying and stopping an electric current. The switch controller 51 controls the instantaneous interruption of an electric current by controlling switching of the switcher 50.

The switcher 50 is constituted of, for example, an FET (Field Effect Transistor). The switcher 50 is arranged at a position which is on a current supply path from the constant current circuit 2 to the light emitting element 1 and which is different from the electric discharge path.

The switch controller 51 outputs an ON/OFF switching signal to the switcher 50 with predetermined timing. In cases where the switcher 50 is an FET, the switch controller 51 outputs a switching signal to a gate electrode of the FET.

The failure detector 6 comprises a diode 60, a DC power supply 61, and a current detector 62. The diode 60, the DC power supply 61, and the current detector 62 are connected to one another in series. The failure detector 6 is connected between the anode and cathode of the light emitting element 1. The diode 60, the DC power supply 61, and the current detector 62 thus form a parallel electric path which is connected to the light emitting element 1 in parallel. In the parallel electric path, the cathode of the diode 60 and the anode of the DC power supply 61 are arranged on the anode side of the light emitting element 1.

The DC power supply 61 generates a direct current reference voltage Vc. The reference voltage Vc is set to a positive value which is lower than the voltage Vf between the anode and cathode of the light emitting element 1 in a normal state. The detail of the reference voltage Vc will be described below. The "normal state" refers to a state in which a short-circuit does not occur.

The current detector 62 detects an electric current which flows in the parallel electric path. The current detector 62 is constituted of, for example, an ammeter. The output signal of the current detector 62 is input to, for example, an input terminal (control input terminal) for a signal for stopping a current supply of the constant current circuit 2.

Figure 2A:
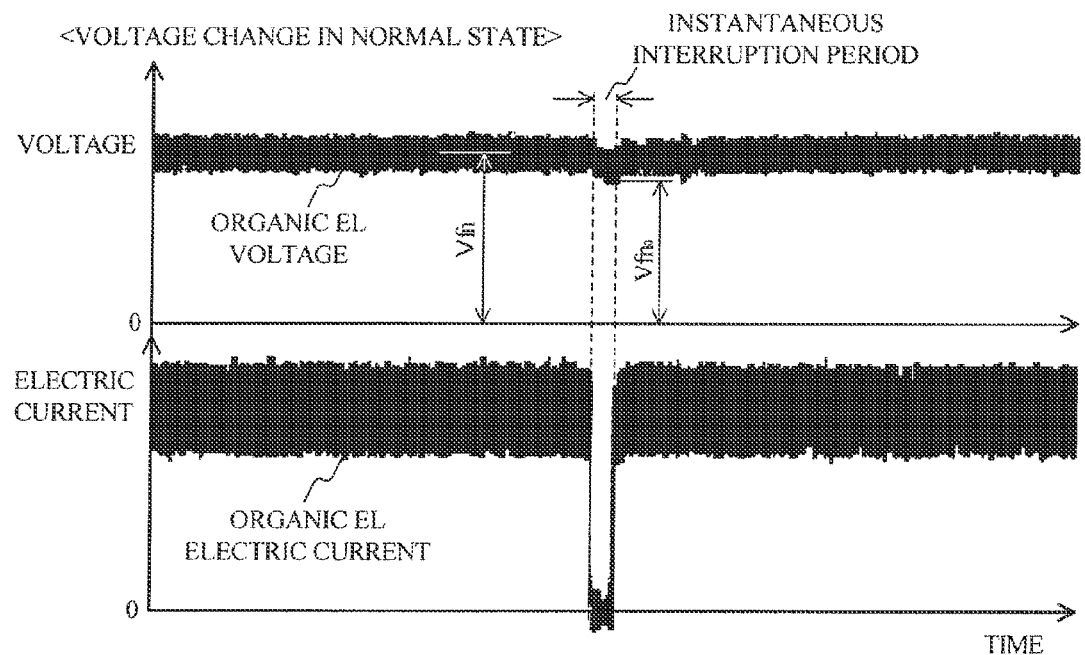
FIG. 2A is a diagram illustrating operation (in a normal state) of the light emitting element failure detector of the Embodiment 1.
Figure 2B:
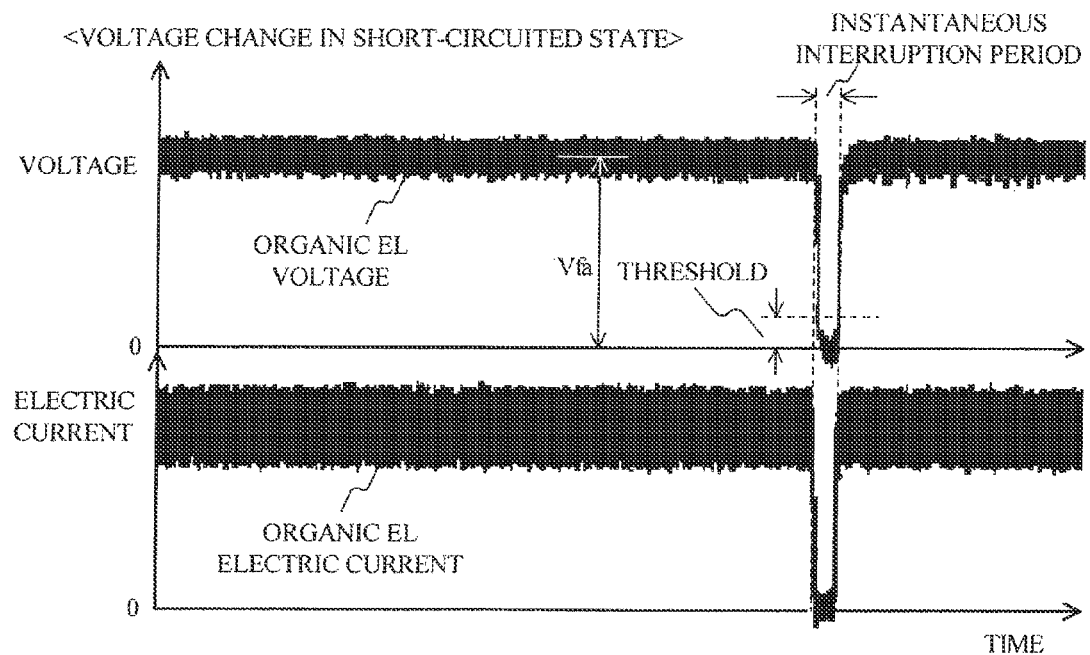
FIG. 2B is a diagram illustrating operation (in a short-circuited state) of the light emitting element failure detector of the Embodiment 1.

FIG. 2A illustrates changes in an electric current which flows in the light emitting element 1 and voltage Vf between the anode and cathode of the light emitting element 1 over time in cases where an electric current is instantaneously interrupted with respect to the light emitting element 1 in a normal state. FIG. 2B illustrates the changes of an electric current which flows to the light emitting element 1 and a voltage Vf between the anode and cathode of the light emitting element 1 over time in cases where an electric current is instantaneously interrupted with respect to the short-circuited light emitting element 1.

Assume that the voltage Vf between the anode and cathode of the light emitting element 1 in a normal state is Vfn. When an electric current is instantaneously interrupted, the voltage Vf slightly decreases from Vfn to $Vfn_0$ as illustrated in FIG. 2A. In other words, the voltage Vf does not rapidly decreases to 0 V. This is because the time constant in which an electric charge which the capacitor 7 and light emitting element 1 accumulate is discharged via an electric discharge path is large.

On the other hand, when the light emitting element 1 is short-circuited, the light emitting element 1 can be replaced with a resistance having a small resistance value as an equivalent circuit. The voltage Vf of the light emitting element 1 thus decreases to a Vfa which is smaller than Vfn. With respect to the short-circuited light emitting element 1, due to a small discharge time constant, the voltage Vf of the light emitting element 1 rapidly decreases to 0 V by an instantaneous interruption of an electric current (FIG. 2B).

The instantaneous interruption period is set to a time which is longer than a time for which the voltage Vf decreases to 0 V with respect to the short-circuited light emitting element 1, and in which stopping of the light emitting of the light emitting element 1 by an instantaneous interruption is not recognized by an observer. The instantaneous interruption period is determined in advance by calculation or a trial. It is noted that the voltage Vf of the light emitting element 1 in a normal state does not decrease to 0 V by an instantaneous interruption in which stopping of the light emitting of the light emitting element 1 is not recognized by an observer.

Accordingly, a threshold for detecting a short circuit failure is set to a value smaller than $Vfn_0$ and larger than 0 V. When the voltage Vf decreases to not higher than the threshold by an instantaneous interruption of an electric current, a light emitting element failure detector 4 detects a short-circuit.

Figure 3A:
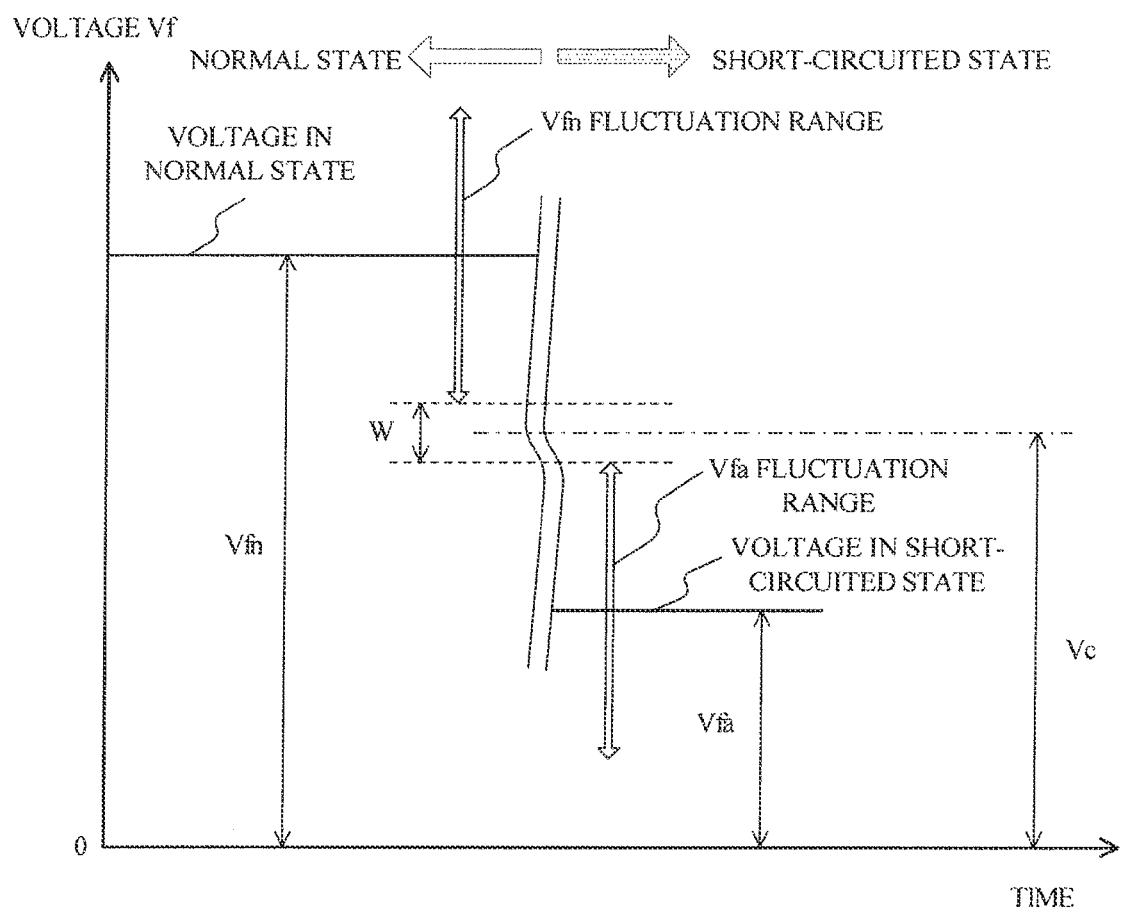
FIG. 3A is a diagram illustrating the setting of a threshold of a conventional light emitting element failure detector.
Figure 3B:
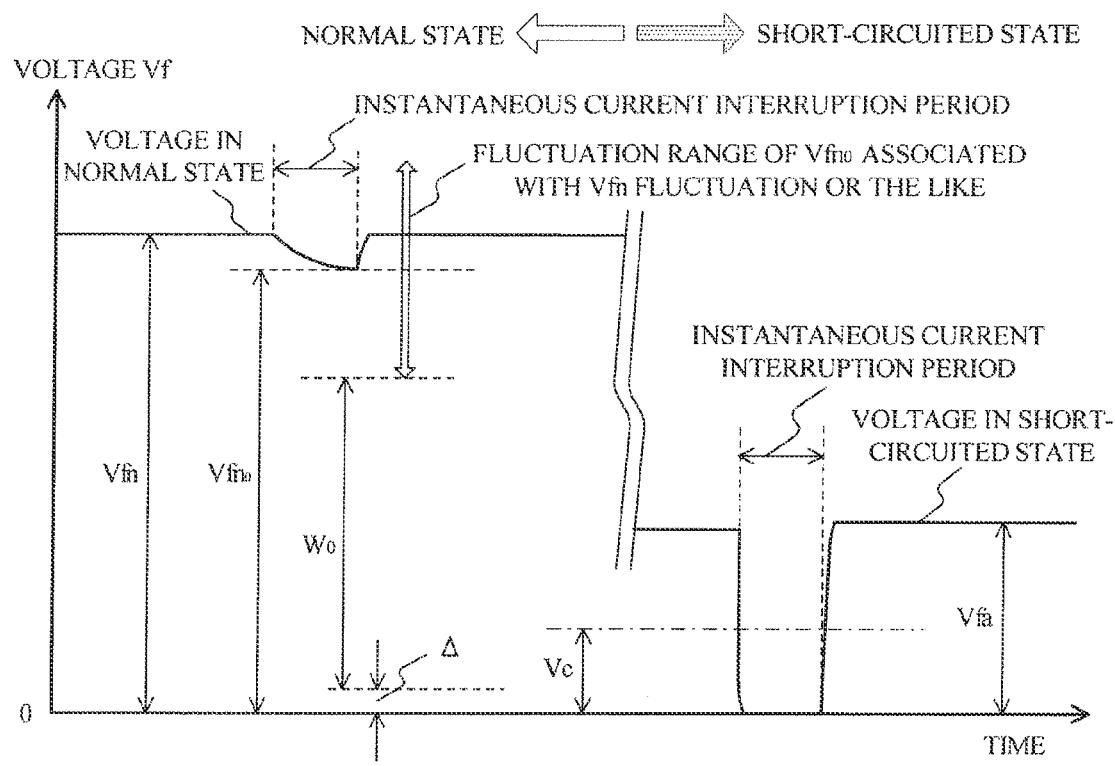
FIG. 3B is a diagram illustrating the setting of a threshold of a light emitting element failure detector of Embodiment 1.

The setting of the threshold will be explained by comparing to a conventional example (FIG. 3A, FIG. 3B). As illustrated in FIG. 3A, conventionally, the threshold is set to a value between Vfn and Vfa. A conventional light emitting element failure detector has detected a short-circuit by whether or not Vf is a threshold or lower. The Vfn largely fluctuates depending on variation in the V-I characteristics, temperature change, or change with time of the light emitting element 1. Since the Vfa depends on the resistance component of the short-circuited light emitting element 1, the Vfa largely fluctuates depending on the state of the short-circuit. Therefore, after predicting fluctuations of Vfn and Vfa, the threshold is set in a range W which does not belong to both fluctuation ranges. Since the range W is narrow, the setting of the threshold is difficult.

On the other hand, in the present embodiment, in cases where an electric current is instantaneously interrupted, the voltage Vf of the light emitting element 1 in a normal state slightly decreases to $Vfn_0$. In the present embodiment, in cases where an electric current is instantaneously interrupted, the voltage Vf of the short-circuited light emitting element 1 rapidly decreases to 0 V. Since, as illustrated in FIG. 3B, $Vfn_0$ fluctuates depending on variation in the V-I characteristics, temperature change, or change with time of the light emitting element 1, the threshold is set to a value lower than the lower limit of the fluctuation of $Vfn_0$ and higher than 0 V (FIG. 3B). The range W0 is considerably wider than a range W of a conventional example. Practically, the term "higher than 0 V" refers to a value which is higher than a value obtained by adding a tolerance $\Delta$ to 0 V. The tolerance $\Delta$ may be a positive value. For example, the tolerance $\Delta$ is set to ½ of a fluctuation width which the voltage Vf has near 0 V.

The magnitude relationship between the threshold and fa (FIG. 3B) needs not be considered. When the threshold is higher than Vfa, an electric current flows into a parallel electric path connected to the short-circuited light emitting element without an instantaneous interruption of an electric current. When the threshold is lower than Vfa, an electric current flows into the parallel electric path connected to the short-circuited light emitting element 1 by instantaneous interruption of an electric current. As the result, the light emitting element failure detector 4 can detect a short-circuit of the light emitting element 1 regardless of the magnitude relationship of the threshold and Vfa (FIG. 3B).

By the above-mentioned setting of the threshold, the light emitting element failure detector 4 can detects as a short circuit failure a case in which the voltage Vf between the anode and cathode of the light emitting element 1 is lower than the threshold when an electric current is instantaneously interrupted.

Operating conditions of the light emitting element failure detector 4 illustrated in FIG. 1 will be concretely explained. The reference voltage Vc of the DC power supply 61 in the light emitting element failure detector 4 is set in the same manner as the above-mentioned threshold.

In FIG. 1, the electric potential of the cathode of the diode 60 is equal to the electric potential of the anode the light emitting element 1. When the light emitting element 1 is in a normal state, the electric potential of the cathode of the diode 60 is higher than the electric potential of the cathode of the light emitting element 1 by Vf. When an electric current does not flow into the parallel electric path, the electric potential of the anode of the diode 60 is higher than the electric potential of the cathode of the light emitting element 1 by Vc. Since the reference voltage Vc is equal to the threshold, the DC power supply 61 Vc is lower than the voltage Vf between the anode and cathode of the light emitting element 1 in a normal state. As the result, a backward voltage Vf−Vc is applied between the anode and cathode of the diode 60. When the light emitting element 1 is in a normal state, an electric current does not flow into the parallel electric path of the failure detector 6. A current detector 62 thus does not detect an electric current.

When the instantaneous current interruption circuit 5 instantaneously interrupt a current supply to the light emitting element 1 in a normal state, a voltage $Vfn_0-Vc$ is applied between the cathode and anode of the diode 60. Since the reference voltage Vc is equal to the threshold, Vc is lower than the minimum value of $Vfn_0$. Accordingly, a backward voltage is applied to the diode 60. Therefore, an electric current does not flow into the parallel electric path.

On the other hand, when an electric current to the short-circuited light emitting element 1 is instantaneously interrupted, the voltage Vf between the anode and cathode of the light emitting element 1 rapidly decreases to 0 V. Since the reference voltage Vc is higher than 0V, the forward voltage Vc is applied to the diode 60. Subsequently, an electric current flows into the parallel electric path of the failure detector 6. When the current detector 62 detects the electric current, the light emitting element failure detector 4 detects a short-circuit of the light emitting element 1.

The current value of the parallel electric path may be a value which can be detected by the current detector 62. The electric current of the diode 60 depends on the forward voltage. For this reason, the reference voltage Vc is set in view of the sensitivity of the current detector 62, the V-I characteristics of the diode 60.

By the connection of an output terminal of the current detector 62 and a control input terminal of the constant current circuit 2, the light emitting element failure detector 4 can stop a current supply from the constant current circuit 2 to the light emitting element 1.

Figure 4:
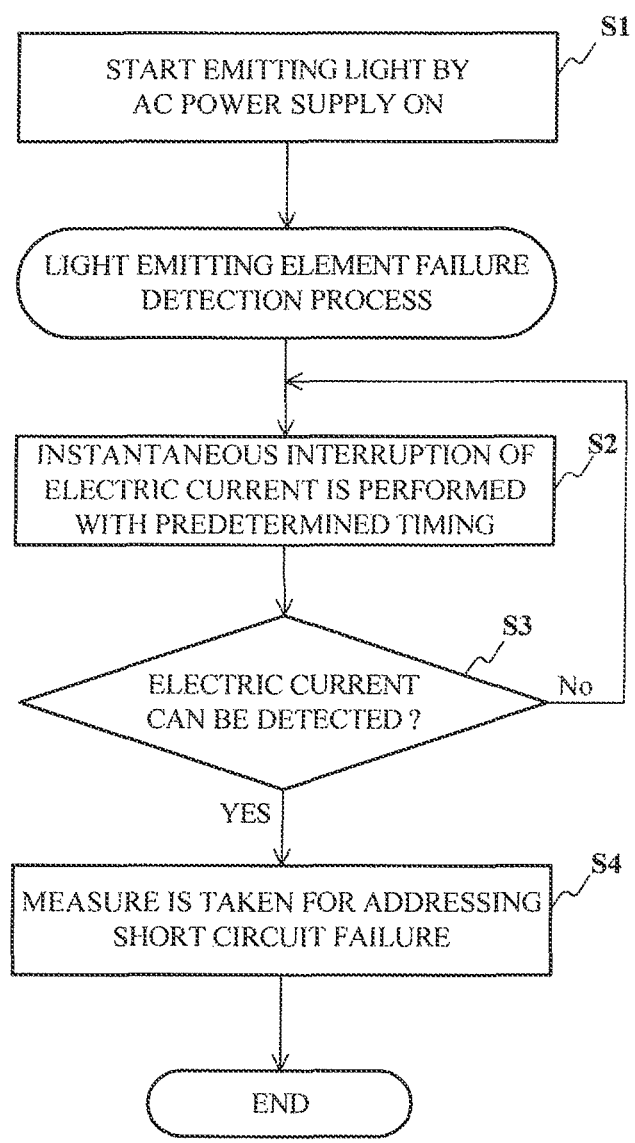
FIG. 4 is a flowchart illustrating a light emitting element failure detection process of Embodiment 1.

FIG. 4 illustrates a flowchart of a light emitting element failure detection process.

The AC power supply 3 is allowed to be in an ON state. By this, the constant current circuit 2 supplies an electric current to the light emitting element 1. The light emitting element 1 to which an electric current is supplied emits light (step S1).

Next, the instantaneous current interruption circuit 5 instantaneously interrupts a current supply to the light emitting element 1 with predetermined timing (step S2). The current detector 62 detects whether an electric current flows into the parallel electric path or not (step S3). When an electric current is detected (step S3; YES), by the output of the current detector 62, a predetermined measure for addressing a short-circuit is carried out (step S4). By this, the light emitting element failure detection process ends. When an electric current is not detected (step S3; NO), the light emitting element failure detection process returns to the step S2. The current detector 62 continues detection of an electric current. A case where an electric current is detected is determined practically by whether a current value exceeds a predetermined threshold or not. The predetermined measure for addressing a short-circuit is, for example, a measure in which the constant current circuit 2 stops a current supply to the light emitting element 1.

By the Embodiment 1, the reference voltage Vc is set without influenced by variation, change, fluctuation, or the like of the voltage Vf between the anode and cathode of the light emitting element 1. Accordingly, by the present Embodiment, the light emitting element failure detector 4 which can detect a short circuit failure without affected by the variation, change, fluctuation or the like of the voltage Vf between the anode and cathode of the light emitting element 1, and a light emitting element failure detection method can be provided.

The direction of the arrangement of the anode and cathode of the diode 60 with respect to the direction of the arrangement of the anode and cathode of the light emitting element 1 and the direction of the arrangement of the cathode and anode of the DC power supply 61 may be as illustrated in FIG. 1. In other words, the order of the arrangement of the diode 60, the DC power supply 61, and the current detector 62 is not particularly restricted.

When a plurality of light emitting elements 1 are connected one another in series, the failure detector 6 is arranged between the anode and cathode of each of the light emitting elements 1. By this, the light emitting element failure detector 4 can detects a short-circuit of the plurality of light emitting elements 1 which are connected one another in series. By the stopping of supply of an electric current, a cascade of short-circuits in the plurality of light emitting elements 1 can be prevented.

Embodiment 2

Figure 5:
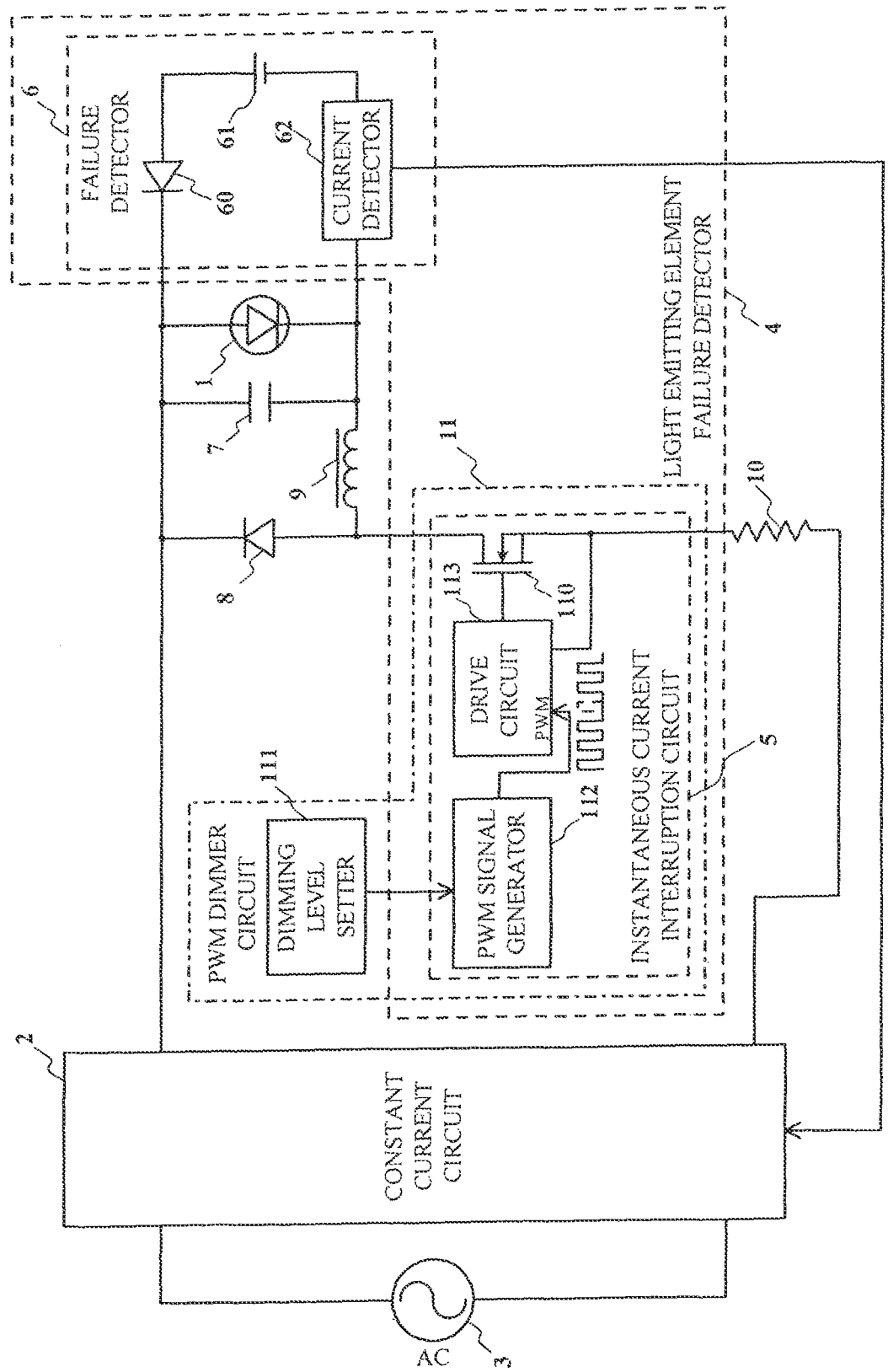
FIG. 5 is a block diagram illustrating the constitution of a light emitting element circuit comprising a light emitting element failure detector of Embodiment 2.

FIG. 5 illustrates an example of the constitution of a light emitting element circuit comprising a light emitting element failure detector 4 of Embodiment 2. In the present Embodiment, the light emitting element circuit uses a PWM (Pulse Width Modulation) control for dimming control of the light emitting element 1.

In the PWM control, a pulse train having a predetermined frequency is supplied to the light emitting element 1. Dimming of the light emitting element 1 is controlled by the pulse width of the supplied pulse.

The optical element circuit of the present Embodiment comprises a PWM dimmer circuit 11. The PWM dimmer circuit 11 comprises a current-controlling switch 110, a dimming level setter 111, a PWM signal generator 112, and a drive circuit 113. The current-controlling switch 110 is arranged on a current supply path to the light emitting element 1 different from the electric discharge path. The current-controlling switch 110 carries out an ON/OFF control of a current supply to the light emitting element 1. The current-controlling switch 110 is constituted of, for example, an FET (FIG. 5). The dimming level setter 111 sets a dimming level of the light emitting element 1. The PWM signal generator 112 selects a pulse width from the set dimming levels. The PWM signal generator 112 generates a pulse train (PWM signal) having a predetermined frequency having the selected pulse width. The drive circuit 113 controls ON/OFF of current supply by the current-controlling switch 110 according to the PWM signal. Other constitutions are similar to Embodiment 1.

In Embodiment 2, the instantaneous current interruption circuit 5 in Embodiment 1 is constituted of a part of the PWM dimmer circuit 11. Specifically, the current-controlling switch 111 serves as the switcher 50 in Embodiment 1. The PWM signal generator 112 and drive circuit 113 serve as the switch controller 51 in Embodiment 1.

Embodiment 2 is characterized in that the PWM signal generator 112 generates a pulse train such that a part of the pulse train is removed in succession at a predetermined cycle. For example, one pulse or a plurality of pulses per N pulses are removed in succession from the pulse train. The period of absence of a pulse created by the removal corresponds to the instantaneous interruption period of an electric current in Embodiment 1.

In Embodiment 2, since an electric current is supplied to the light emitting element 1 in a pulse train, an instantaneous interruption of an electric current constantly occurs. Accordingly, a voltage drop constantly occurs in accordance with the pulse train. However, when the pulse train is continuous, the instantaneous interruption period is very short, and therefore, the voltage Vf does not rapidly decrease to 0 V. In a state where the light emitting element 1 is short-circuited, the PWM signal generator 112 selects the number of pulses to be serially removed, based on the time for which the voltage Vf decreases to 0 V and the pulse width. The setting of the instantaneous interruption period is similar to Embodiment 1. The pulse width is selected by the PWM signal generator 112 depending on the pulse width.

The operating conditions of the present Embodiment are similar to that of Embodiment 1 except for the method of instantaneous interruption.

In Embodiment 2, the PWM signal generator 112 generates a pulse train in which a pulse is removed at a predetermined cycle. By supplying the pulse train from which a pulse has been removed to the light emitting element 1, the PWM signal generator 112 and drive circuit 113 have the function of the switch controller 51 in Embodiment 1. A current-controlling switch 110 has the function of the switcher 50 in Embodiment 1. According to Embodiment 2, the instantaneous current interruption circuit 5 can be attained without adding a new hardware.

The light emitting element failure detector 4 in the present Embodiment has a similar advantageous effect to the effect described in Embodiment 1.

A part or the whole of the above-mentioned Embodiments can be as described in the following appendices, but not limited thereto.

Appendix 1

A light emitting element failure detector that detects a short-circuit of a light emitting element in a light emitting element circuit that includes the light emitting element, a current supply path to the light emitting element, a constant current circuit that supplies an electric current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detector comprising:
  an instantaneous current interruption circuit that is arranged on the current supply path different from the electric discharge path and that instantaneously interrupts an electric current that the constant current circuit supplies to the light emitting element, and
  a parallel electric path connected to the light emitting element in parallel between anode and cathode of the light emitting element, wherein
  the parallel electric path comprises
    a diode,
    a DC power supply that generates a direct current reference voltage having a positive value lower than a voltage between the anode and cathode of the light emitting element in a normal state, and
    a current detector, wherein
    the diode, the DC power supply, and the current detector are connected to one another in series, and the diode and the DC power supply are connected to each other such that a cathode of the diode and an anode of the DC power supply are each arranged on the anode side of the light emitting element, and
  the current detector detects the existence of an electric current on the parallel electric path in a period when an electric current is instantaneously interrupted by the instantaneous current interruption circuit.

Appendix 2

The light emitting element failure detector according to Appendix 1, wherein the instantaneous current interruption circuit comprises
  a switcher that switches between supplying and stopping an electric current from the constant current circuit to the light emitting element, and
  a switch controller that controls switching of the switcher.

Appendix 3

The light emitting element failure detector according to Appendix 2, wherein
  the light emitting element circuit further comprises a PWM signal generator that sets a pulse width based on a set dimming level and generates a PWM signal comprising a pulse train having the set pulse width, a drive circuit that receives the PWM signal generated in the PWM signal generator and outputs a PWM control signal comprising a pulse train having the same pattern as the pattern of the PWM signal, and a current-controlling switch that is arranged on the current supply path, to which the PWM control signal is input, and switches supplying and stopping of an electric current to the light emitting element by the PWM control signal,
  the PWM signal generator generates the PWM signal by removing at least one pulse in succession from the pulse train at a predetermined cycle and supplies the generated PWM signal to the drive circuit,
  the current-controlling switch arranged on the current supply path different from the electric discharge path serves as the switcher, and
  the PWM signal generator and the drive circuit serve as the switch controller by setting a period of absence of a pulse due to removal of the pulse in succession to the instantaneous interruption period of an electric current.

Appendix 4

The light emitting element failure detector according to Appendix 3, wherein the PWM signal generator selects the number of pulse which is removed in succession based on the set pulse width and the instantaneous interruption period which is set in advance.

Appendix 5

The light emitting element failure detector according to any one of Appendices 1 to 4, wherein the light emitting element is an organic EL element.

Appendix 6

The light emitting element failure detector according to any one of Appendices 1 to 4, wherein the light emitting element is an LED element.

Appendix 7

A light emitting element failure detection method that detects a short-circuit of a light emitting element in a light emitting element circuit that includes the light emitting element, a current supply path to the light emitting element, a constant current circuit that supplies an electric current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detection method comprising:

an instantaneous current interruption step in which, on the current supply path different from the electric discharge path, an electric current that the constant current circuit supplies to the light emitting element is instantaneously interrupted, and a current detection step in which the existence of an electric current on a parallel electric path in a period is detected when an electric current is instantaneously interrupted in the instantaneous current interruption step, in a state in which a DC power supply that generates a direct current reference voltage having a positive value lower than a voltage between the anode and cathode of the light emitting element in a normal state and a diode are connected to each other, and in the parallel electric path connected to the light emitting element in parallel between the anode and cathode of the light emitting element, the diode and the DC power supply are connected to each other such that a cathode of the diode and an anode of the DC power supply are each arranged on the anode side of the light emitting element.

The above-mentioned Embodiments are illustrations of specific embodiments of the present invention, and are not intended for limiting the technical scope of the present invention. The present invention can be freely modified, applied, or improved to be carried out within the technical spirit described in CLAIMS.

The present invention is based on Japanese Patent Application No. 2011-148785, filed on Jul. 5, 2011. DESCRIPTION, CLAIMS, and DRAWINGS of Japanese Patent Application No. 2011-148785 are hereby incorporated by reference in their entirety.

INDUSTRIAL APPLICABILITY

The present invention can be applied to various field in which a light emitting element or a light emitting element is used.

REFERENCE SIGNS LIST

1 Light emitting element
2 Constant current circuit
3 AC power supply
4 Light emitting element failure detector
5 Instantaneous current interruption circuit
6 Failure detector
7 Capacitor
8 Diode
9 Coil
10 Resistance
11 PWM dimmer circuit
50 Switcher
51 Switch controller
60 Diode
61 DC power supply
62 Current detector
110 Current-controlling switch
111 Dimming level setter
112 PWM signal generator
113 Drive circuit

The invention claimed is:

1. A light emitting element failure detector that detects a short-circuit of a light emitting element in a light emitting element circuit that includes the light emitting element, a current supply path that supplies a current causing the light emitting element to emit light, a constant current circuit that supplies an electric current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detector comprising:

an instantaneous current interruption circuit that is arranged on the current supply path different from the electric discharge path and that instantaneously interrupts an electric current that the constant current circuit supplies to the light emitting element, and a parallel electric path connected to the light emitting element in parallel between an anode and cathode of the light emitting element, the parallel electric path being different from the current supply path and from the electric discharge path, wherein the parallel electric path comprises
a diode,
a DC power supply that generates a direct current reference voltage having a positive value lower than a voltage between the anode and cathode of the light emitting element in a normal state, in which the direct current reference voltage is applied to the light emitting element via the diode, and
a current detector, wherein in the parallel electric path, the diode, the DC power supply, and the current detector are connected to one another in series, and the diode and the DC power supply are connected to each other such that a cathode of the diode and an anode of the DC power supply are each arranged on the anode side of the light emitting element, and the current detector detects the existence of an electric current on the parallel electric path in a period when an electric current is instantaneously interrupted by the instantaneous current interruption circuit.

2. The light emitting element failure detector according to claim 1, wherein the instantaneous current interruption circuit comprises a switcher that switches between supplying and stopping an electric current from the constant current circuit to the light emitting element, and a switch controller that controls switching of the switcher.

3. A light emitting element failure detector that detects a short-circuit of a light emitting element in a light emitting element circuit that includes the light emitting element, a current supply path to the light emitting element, a constant current circuit that supplies an electric current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detector comprising:

- an instantaneous current interruption circuit that is arranged on the current supply path different from the electric discharge path and that instantaneously interrupts an electric current that the constant current circuit supplies to the light emitting element, and
- a parallel electric path connected to the light emitting element in parallel between an anode and cathode of the light emitting element, the parallel electric path being different from the electric discharge path, wherein the parallel electric path comprises
  - a diode,
  - a DC power supply that generates a direct current reference voltage having a positive value lower than a voltage between the anode and cathode of the light emitting element in a normal state, in which the direct current reference voltage is applied to the light emitting element via the diode, and
  - a current detector, wherein in the parallel electric path, the diode, the DC power supply, and the current detector are connected to one another in series, and the diode and the DC power supply are connected to each other such that a cathode of the diode and an anode of the DC power supply are each arranged on the anode side of the light emitting element, and the current detector detects the existence of an electric current on the parallel electric path in a period when an electric current is instantaneously interrupted by the instantaneous current interruption circuit, wherein the instantaneous current interruption circuit comprises
  - a switcher that switches between supplying and stopping an electric current from the constant current circuit to the light emitting element, and
  - a switch controller that controls switching of the switcher, wherein
the light emitting element circuit further comprises a PWM signal generator that sets a pulse width based on a set dimming level and generates a PWM signal comprising a pulse train having the set pulse width, a drive circuit that receives the PWM signal generated in the PWM signal generator and outputs a PWM control signal comprising a pulse train having the same pattern as the pattern of the PWM signal, and a current-controlling switch that is arranged on the current supply path, to which the PWM control signal is input, and switches supplying and stopping of an electric current to the light emitting element by the PWM control signal, the PWM signal generator generates the PWM signal by removing at least one pulse in succession from the pulse train at a predetermined cycle and supplies the generated PWM signal to the drive circuit, the current-controlling switch arranged on the current supply path different from the electric discharge path serves as the switcher, and the PWM signal generator and the drive circuit serve as the switch controller by setting a period of absence of a pulse due to removal of the pulse in succession to the instantaneous interruption period of an electric current.

4. The light emitting element failure detector according to claim 3, wherein the PWM signal generator selects the number of pulse which is removed in succession based on the set pulse width and the instantaneous interruption period which is set in advance.

5. The light emitting element failure detector according to claim 1, wherein the light emitting element is an organic EL element.

6. The light emitting element failure detector according to claim 1, wherein the light emitting element is an LED element.

7. A light emitting element failure detection method that detects a short-circuit of a light emitting element in a light emitting element circuit that includes the light emitting element, a current supply path that supplies a current causing the light emitting element to emit light, a constant current circuit that supplies an electric current to the light emitting element via the current supply path, and an electric discharge path that discharges an electric charge accumulated at the light emitting element and at a region connected between both electrodes of the light emitting element when the constant current circuit stops a current supply to the light emitting element, the light emitting element failure detection method comprising:

- an instantaneous current interruption step in which, on the current supply path different from the electric discharge path, an electric current that the constant current circuit supplies to the light emitting element is instantaneously interrupted, and
- a current detection step in which the existence of an electric current on a parallel electric path, the parallel electric path being different from the current supply path and from the electric discharge path, in a period is detected when an electric current is instantaneously interrupted in the instantaneous current interruption step, in a state in which a diode and a DC power supply that generates a direct current reference voltage having a positive value lower than a voltage between the anode and cathode of the light emitting element in a normal state, in which the direct current reference voltage is applied to the light emitting element via the diode, are connected to each other, and in the parallel electric path connected to the light emitting element in parallel between the anode and cathode of the light emitting element, the diode and the DC power supply are connected to each other such that a cathode of the diode and an anode of the DC power supply are each arranged on the anode side of the light emitting element.

* * * * *